(12) United States Patent
Tan et al.

(10) Patent No.: US 11,361,584 B2
(45) Date of Patent: Jun. 14, 2022

(54) FINGERPRINT IDENTIFICATION DEVICE AND METHOD FOR CONTROLLING THE SAME, TOUCH DISPLAY PANEL AND TOUCH DISPLAY DEVICE

(71) Applicant: BOE TECHNOLOGY GROUP CO., LTD., Beijing (CN)

(72) Inventors: Jifeng Tan, Beijing (CN); Yafeng Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1051 days.

(21) Appl. No.: 15/780,215

(22) PCT Filed: Oct. 19, 2017

(86) PCT No.: PCT/CN2017/106844
§ 371 (c)(1),
(2) Date: May 30, 2018

(87) PCT Pub. No.: WO2018/171178
PCT Pub. Date: Sep. 27, 2018

(65) Prior Publication Data
US 2021/0174052 A1    Jun. 10, 2021

(30) Foreign Application Priority Data

Mar. 24, 2017  (CN) .......................... 201710183516.8

(51) Int. Cl.
*G01B 11/24* (2006.01)
*G06V 40/13* (2022.01)
(Continued)

(52) U.S. Cl.
CPC ........ *G06V 40/1324* (2022.01); *G06F 3/0412* (2013.01); *G06F 3/0421* (2013.01);
(Continued)

(58) Field of Classification Search
CPC .................. G06K 9/00046; G06K 9/0004; G06F 3/0412; G06F 3/0421; G06F 2203/04109;
(Continued)

(56) References Cited

U.S. PATENT DOCUMENTS

2013/0120760 A1* 5/2013 Raguin ................ G06K 9/0004
356/612
2013/0135258 A1* 5/2013 King ..................... G06F 3/0428
345/175

(Continued)

FOREIGN PATENT DOCUMENTS

| CN | 103677448 A | 3/2014 |
|----|-------------|--------|
| CN | 105678255 A | 6/2016 |

(Continued)

OTHER PUBLICATIONS

English Translation of International Search Report & Written Opinion, for PCT Patent Application No. PCT/CN2017/106844, dated Jan. 18, 2018, 9 pages.

*Primary Examiner* — Abdul-Samad A Adediran
(74) *Attorney, Agent, or Firm* — Kinney & Lange, P.A.

(57) ABSTRACT

A fingerprint identification device, a touch display panel and a method for controlling fingerprint identification are provided in embodiments of the disclosure. The fingerprint identification device includes: a photoelectric sensor; and an optical waveguide, arranged on a touch substrate at another side, and configured to be in touch with a fingerprint, and comprising waveguide material portions and medium material portions, each of the waveguide material portions and each of the medium material portions being spaced apart from each other; and a light irradiating into the waveguide material portions is delivered to the surface(s) of the waveguide material portions facing away from the touch substrate after total reflections at interfaces between the medium material portions and the waveguide material portions. If a (Continued)

portion of valleys of the fingerprint gets in touch with the surface(s), since the portion of valleys is filled with air, then the light returns by total reflection so as to be identified by the photoelectric sensor; if a portion of ridges of the fingerprint gets in touch with the surface(s), the light at the portion of ridges is reflected by diffuse reflection so as not to be reflected back for identification by the photoelectric sensor. The fingerprint identification in embodiments of the disclosure is adapted to various display devices.

11 Claims, 5 Drawing Sheets

(51) Int. Cl.
*G06F 3/041* (2006.01)
*G06F 3/042* (2006.01)
*H01L 27/146* (2006.01)
*H01L 27/32* (2006.01)
*H01L 51/52* (2006.01)

(52) U.S. Cl.
CPC .... *G06V 40/1318* (2022.01); *H01L 27/14621* (2013.01); *H01L 27/14629* (2013.01); *H01L 27/322* (2013.01); *H01L 27/3234* (2013.01); *H01L 51/5237* (2013.01); *G06F 2203/04109* (2013.01)

(58) Field of Classification Search
CPC .. G06F 3/04166; G06F 3/0428; G06F 3/0445; H01L 27/14621; H01L 27/14629; H01L 27/322; H01L 27/3234; H01L 51/5237
USPC .............. 250/227.11; 345/173, 175; 356/612
See application file for complete search history.

(56) References Cited

U.S. PATENT DOCUMENTS

| | | | |
|---|---|---|---|
| 2015/0331508 A1* | 11/2015 | Nho | ................. G06F 3/0445 345/173 |
| 2015/0369661 A1* | 12/2015 | Lin | ................. G06K 9/0004 250/227.11 |
| 2018/0113548 A1* | 4/2018 | Lee | ................. G06F 3/04166 |

FOREIGN PATENT DOCUMENTS

| | | |
|---|---|---|
| CN | 106228144 A | 12/2016 |
| CN | 106934384 A | 7/2017 |
| WO | 2013105711 A1 | 7/2013 |

* cited by examiner

FINGERPRINT IDENTIFICATION DEVICE AND METHOD FOR CONTROLLING THE SAME, TOUCH DISPLAY PANEL AND TOUCH DISPLAY DEVICE

CROSS-REFERENCE TO RELATED APPLICATIONS

This application is a Section 371 National Stage Application of International Application No. PCT/CN2017/106844, filed on Oct. 19, 2017, entitled "FINGERPRINT IDENTIFICATION DEVICE AND METHOD FOR CONTROLLING THE SAME, TOUCH DISPLAY PANEL AND TOUCH DISPLAY DEVICE", which has not yet published, which claims priority to Chinese Patent Application Invention No. 201710183516.8 filed on Mar. 24, 2017 in the State Intellectual Property Office of China, the whole disclosure of which is incorporated herein by reference.

BACKGROUND OF THE DISCLOSURE

Field of the Disclosure

Embodiments of the present disclosure relate to the technical field of display apparatus, and in particular, to a fingerprint identification device and a method for controlling the same, a touch display panel and a touch display device.

Description of the Related Art

Nowadays, the fingerprint identification technology is widely used in various fields, such as electronic equipment terminals (comprising mobilephone, tablet computer and television set and the like), safeguard systems (comprising entrance guard/access badge, safe (box) and the like), and so on. There are some main ways for implementing acquisition of fingerprint comprising: optical fingerprint identification, capacitive fingerprint identification and ultrasonic imaging fingerprint identification and the like, and the optical fingerprint identification has a relatively large identification range and a relatively low cost as compared with other ways for implementing acquisition of fingerprint.

At present, in relevant art, a liquid crystal display (e.g., in a mobile terminal such as a mobilephone and the like) utilizes the optical fingerprint identification, typically by using a backlight source to emit a light to illuminate a finger, and then the light is reflected by diffuse reflection at the finger to a photoelectric sensor device to implement an identification of a pattern of the fingerprint of the finger.

SUMMARY OF THE DISCLOSURE

The embodiments of the present disclosure have been made to overcome or alleviate at least one aspect of the above mentioned disadvantages and/or shortcomings in the prior art, ie., a problem in the prior art that the fingerprint may not be identified accurately in existing liquid crystal display, by providing a fingerprint identification device for a touch substrate and a method for controlling the same, a touch display panel and a touch display device.

Following technical solutions are adopted in exemplary embodiments of the invention for achieving the above desired technical purposes.

According to an aspect of the exemplary embodiment of the present disclosure, there is provided a fingerprint identification device, comprising: a photoelectric sensor; and an optical waveguide, arranged on a touch substrate, and configured to be in touch with a fingerprint, and comprising waveguide material portions and medium material portions, each of the waveguide material portions and each of the medium material portions being spaced apart from each other; and surfaces of both the medium material portions and the waveguide material portions facing away from the touch substrate are configured to be in touch with the fingerprint, and the optical waveguide is configured to deliver a light irradiating into the waveguide material portions from the touch substrate, to the surfaces of the waveguide material portions facing away from the touch substrate by total reflections at interfaces between the medium material portions and the waveguide material portions.

According to an embodiment of the disclosure, a surface of each of the waveguide material portions interfacing with the touch substrate is defined as a first interface, two surfaces of each of the waveguide material portions interfacing with the two adjacent medium material portions respectively are defined as a second interface and a third interface, and a surface of each of the waveguide material portions facing away from the touch substrate is defined as a fourth interface; and in a condition that a portion of valleys of the fingerprint gets in touch with the optical waveguide, the light which irradiates into each of the waveguide material portions from the first interface thereof is reflected by total reflection at both the second interface and the third interface thereof, then transmitted to and reflected back by total reflection at the fourth interface thereof, and in turn reflected back by total reflection at both the second interface and the third interface again to return to the photoelectric sensor for identification thereby; and in a condition that a portion of ridges of the fingerprint faces towards and gets in touch with the optical waveguide, the light which irradiates into each of the waveguide material portions from the first interface thereof is reflected by total reflection at both the second interface and the third interface and propagates to the fourth interface thereof and exits from the fourth interface, so as not to be substantially identified by the photoelectric sensor.

According to an embodiment of the disclosure, the second surface and the third surface are both arc-shaped surfaces protruding towards a side on which side one of the second interface and the third interface is located.

According to an embodiment of the disclosure, the waveguide material portions have a refractive index of n2, and the medium material portions have a refractive index of n3, and a material of the touch substrate has a refractive index of n1, and both n3 and n1 are less than n2.

According to another aspect of the exemplary embodiment of the present disclosure, there is provided a touch display panel, comprising: the fingerprint identification device as above, and a touch display substrate functioning as the touch substrate; and the optical waveguide is provided on a touch display surface of the touch display substrate, and the photoelectric sensor is provided at a side of the touch display substrate facing away from the optical waveguide.

According to an embodiment of the disclosure, the optical waveguide comprises a plurality of optical sub-waveguides, and the photoelectric sensor comprises a plurality of photoelectric sub-sensors, the plurality of optical sub-waveguides being in one-to-one correspondence with the plurality of photoelectric sub-sensors.

According to an embodiment of the disclosure, the touch display substrate comprises: pixel regions; and non-pixel regions on peripheries of the pixel regions, with the photoelectric sensor being in the non-pixel regions.

According to an embodiment of the disclosure, the touch display substrate is of an OLED structure comprising a light-emitting layer, an encapsulation layer and a covering layer arranged in sequence, and the fingerprint identification device further comprises a buffer layer between the optical waveguide and the touch display substrate and the buffer layer is configured such that a refractive index of a material forming the buffer layer is the same as a refractive index of a material forming the encapsulation layer.

According to an embodiment of the disclosure, the touch display panel further comprises: a color filter substrate; and an array substrate opposite to a color filter substrate; the photoelectric sensor is on a side of the array substrate close to the color filter substrate.

According to yet another aspect of the exemplary embodiment of the present disclosure, there is provided a method for controlling the fingerprint identification device as above, comprising a following step: implementing the identification of fingerprint by the photoelectric sensor depending on a signal of the light reflected at the fingerprint which signal is received by the photoelectric sensor, in a condition that the fingerprint identification device is in touch with fingerprint.

According to an embodiment of the disclosure, there is an angle θ1 between a light irradiating towards the first interface and a normal of the first interface, by controlling according to a formula of:

$$\theta 1 \leq \arcsin\left[\frac{n2}{n1}\sin\left(\arccos\left(\frac{n3}{n2}\right)\right)\right]$$

such that the light irradiating towards the first interface is reflected by total reflection at both the second interface and the third interface and in turn propagates to the fourth interface, wherein the waveguide material portion has a refractive index of n2 and the medium material portion has a refractive index of n3.

According to an embodiment of the disclosure, there is an angle θ2 between a direction of a light irradiating towards the second interface from the first interface and a normal of the second interface, by controlling according to a formula of:

$$\theta 2 \geq \arcsin\frac{1}{n2}$$

such that the light is reflected in its return by total reflection at the fourth interface and then at both the second interface and the third interface respectively and is in turn received by the photoelectric sensor.

According to an embodiment of the disclosure, the method further comprises a step of recording a signal of stray lights received by the photoelectric sensor before implementing the identification of fingerprint; and implementing the identification of fingerprint by the photoelectric sensor depending on a signal of the light reflected at the fingerprint which signal is received by the photoelectric sensor comprises subtracting the signal of stray lights from the signal of the light reflected at the fingerprint which signal is received by the photoelectric sensor, followed by implementing the identification of fingerprint.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF PREFERRED EMBODIMENTS OF THE DISCLOSURE

Figure 1:
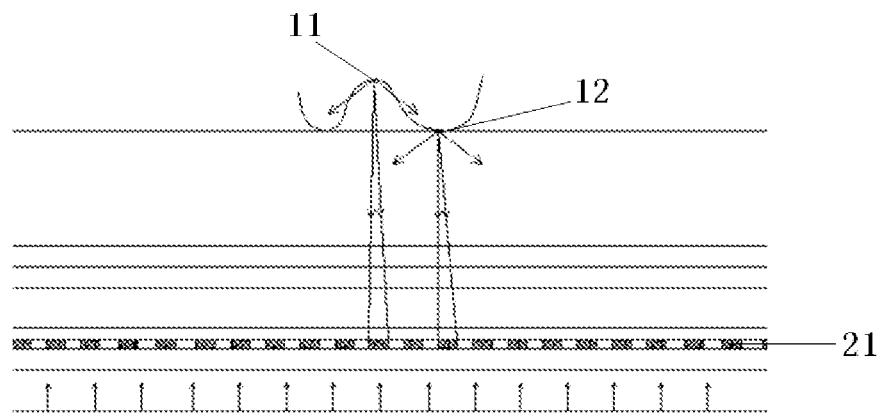
FIG. 1 illustrates a structural schematic view of a fingerprint identification structure of a liquid crystal display according to a fundamental embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of a fingerprint identification device, a touch display panel and a touch display device.

According to a general technical concept of the present disclosure, there is provided a fingerprint identification device, comprising: a photoelectric sensor; and an optical waveguide, arranged on the touch substrate and configured to be in touch with a fingerprint, and the optical waveguide comprising waveguide material portions and medium material portions, each of the waveguide material portions and each of the medium material portions being spaced apart from each other. And surfaces of both the medium material portions and the waveguide material portions facing away from the touch substrate are configured to be in touch with the fingerprint, so as to deliver a light which irradiates into the waveguide material portions from the touch substrate to the surfaces of the waveguide material portions facing away from the touch substrate after being reflected by total reflection at interfaces between the medium material portions and the waveguide material portions.

In a fundamental example, as illustrated in FIG. 1, e.g., light beams emitted by a backlight source are reflected by diffuse reflection at the fingerprint, and a portion of the light beams are received by photoelectric sensor(s) 21; and in the portion of the light beams received by photoelectric sensors, an energy of the light reflected by diffuse reflection at the ridge 12 of the fingerprint may differ from an energy of the light reflected by diffuse reflection at the valley 11 of the fingerprint (since the energy of light reflected by the valley 11 of the fingerprint may be smaller than the energy of light reflected by the ridge 12 of the fingerprint), and then the fingerprint identification may be implemented thereby.

However, since the liquid crystal layer has a relatively low transmittance, then in above liquid crystal display, the light beams originating from the backlight source should necessarily propagate twice (i.e., two single-passes) therethrough, and then the energy of light arrived at the photoelectric sensor(s) 21 is very low; the photoelectric sensor(s) 21 may only receive a portion of the light beams reflected by diffuse reflection at the fingerprint of the finger. Furthermore, there is a limited difference between the energy of divergent light reflected by diffuse reflection at the valley 11 of the fingerprint and the energy of divergent light reflected by diffuse reflection at the ridge 12 of the fingerprint, and there also exists interference by ambient light between the valley 11 and the ridge 12 of the fingerprint of the finger. Therefore, above liquid crystal display may not be sufficient for identification of the fingerprint at a high accuracy.

A series of improved exemplary embodiments of the disclosure are further set forth in detail hereinafter.

Figure 2:
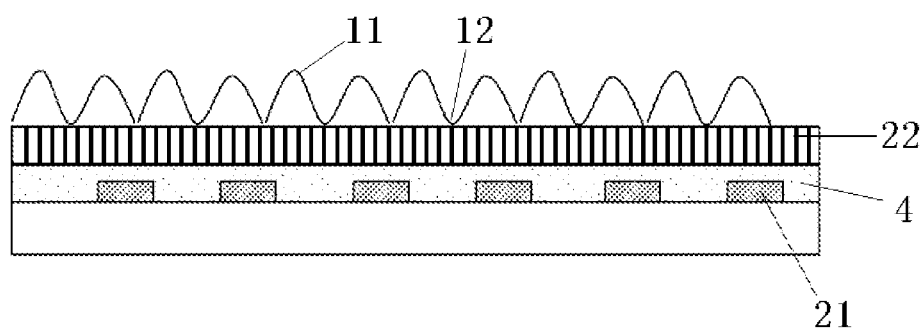
FIGS. 2-4 illustrate structural schematic views of a fingerprint identification device according to a first embodiment of the disclosure.
Figure 3:
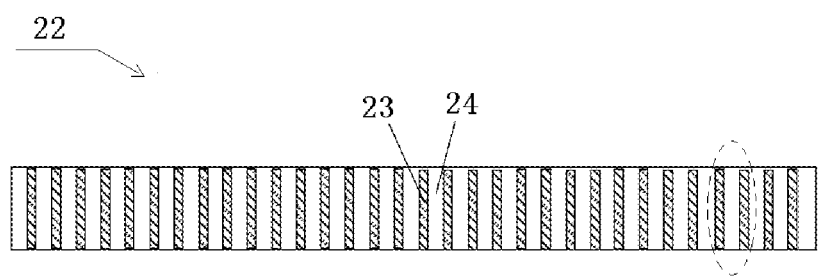
Figure 4:
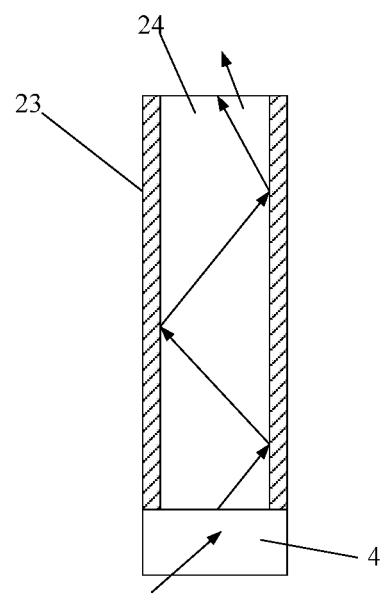

A fingerprint identification device is provided in the embodiment, as illustrated in FIGS. 2-4, the fingerprint identification device comprises a photoelectric sensor 21 and an optical waveguide 22 arranged on a touch substrate and configured to be in touch with the fingerprint. Furthermore, the optical waveguide 22 comprises medium material portions 23 and waveguide material portions 24, each of the waveguide material portions 24 and each of the medium material portions 23 being spaced apart from each other; respective surfaces of both the medium material portions 23 and the waveguide material portions 24 facing away from the touch substrate 4 are configured to be in touch with the fingerprint, and the optical waveguide is configured to deliver a light irradiating into the waveguide material portions 24 through the touch substrate 4, to the surfaces of the waveguide material portions 24 facing away from the touch substrate 4 after total reflections at interfaces between the medium material portions 23 and the waveguide material portions 24.

Specifically, as illustrated in FIG. 2, the fingerprint identification device comprises the photoelectric sensor 21 disposed inside the touch substrate (or disposed at the lower side thereof) and the optical waveguide 22 disposed on the touch substrate; and as illustrated in FIG. 3, the optical waveguide 22 comprises medium material portions 23 and waveguide material portions 24, each of the waveguide material portions and each of the medium material portions being disposed vertically and spaced apart from and alternating with each other. FIG. 4 illustrates a partial enlarged view of a portion surrounded in a dotted circle of the optical waveguide 22 as illustrated in FIG. 3. As illustrated in FIG. 4, after the light is incident onto the lower end surface of the waveguide material portion 24 through the touch substrate 4, the light is reflected several times by total reflection at interfaces between the medium material portion 23 and waveguide material portion 24, and then propagates to a surface of the waveguide material portion 24 facing away from the touch substrate 4. As such, in a condition that the valley 11 of the fingerprint gets in touch with the surface of the waveguide material portion 24 facing away from the touch substrate 4, then, since a space defined between the valley 11 and the waveguide material portion 24 is for example filled with air, the light is reflected by total reflection at an interface between air and the surface of the waveguide material portion 24 and then returns so as to be identified/recognized by the photoelectric sensor 21. And in a condition that a portion of ridges of the fingerprint gets in touch with and abuts against the surface of the waveguide material portion 24 facing away from the touch substrate 4, then the light is reflected by diffuse reflection at the ridge 12 and in turn emits outwards therefrom so as not to be substantially identified by the photoelectric sensor 21. Here, the expression "not to be substantially identified" means that even if some portion of the light may be reflected back by diffuse reflection and received at the photoelectric sensor, the intensity of such portion of the light received at the photoelectric sensor may not be sufficient to complete the identification.

As such, it increases the difference between the light which is reflected back at the ridge 12 and identified by the photoelectric sensor 21 and the light which is reflected back at the valley 11 and identified by the photoelectric sensor 21, so as to further enhance the accuracy in identification of valley(s) and ridge(s) by the photoelectric sensor.

A fingerprint identification device is provided, as illustrated in FIGS. 5-8, comprising: a photoelectric sensor 21, and an optical waveguide 22 disposed on the touch substrate 4 and configured to get in touch with the fingerprint; the optical waveguide 22 comprising medium material portions 23 and waveguide material portions 24 spaced apart from each other, e.g., the medium material portions 23 and waveguide material portions 24 are provided essentially vertically on the touch substrate 4 and arranged alternatively. An interface between the waveguide material portions 24 and the touch substrate 4 is defined as a first interface, two interfaces between the waveguide material portions 24 and two adjacent medium material portions 23 are defined respectively as a second interface and a third interface, and an interface of the waveguide material portions 24 facing away from the touch substrate 4 is defined as a fourth interface; the fourth interface is configured to be in touch with the fingerprint of the finger, such that the light which irradiates into the waveguide material portions 24 through the first interface is then reflected several times by total reflection at both the second interface and the third interface and then propagates to the fourth interface thereof.

Once the valley 11 of the fingerprint faces gets in touch with the optical waveguide 22, after the light which is incident into the waveguide material portions 24 through the first interface to enter the optical waveguide portions 24 is then reflected back by total reflection at both the second interface and the third interface, and in turn propagates to the fourth interface, the light is subsequently reflected back by total reflection at the fourth interface and then at both the second and the third interfaces so as to return to the photoelectric sensor 21 for identification.

Once the ridge 12 of the fingerprint gets in touch with the optical waveguide 22, the light which irradiates into the waveguide material portion 24 from the first interface thereof is reflected by total reflection at both the second interface and the third interface and propagates to the fourth interface thereof and then exits therefrom, so as not to be reflected back into the photoelectric sensor 21 and thus not to be substantially identified by the photoelectric sensor 21. Here, the expression "not to be substantially identified" means that even if some portion of the light may be reflected back by diffuse reflection and received at the photoelectric sensor, the intensity of such portion of the light received at the photoelectric sensor may not be sufficient to complete the identification.

In an exemplary embodiment of the disclosure, by way of example, each waveguide material portion 24 has a refractive index of n2, and each medium material portion 23 has a refractive index of n3, and a material forming the touch substrate 4 has a refractive index of n1, wherein n3 is smaller than n2 and n1 is smaller than n2.

Specifically, the waveguide material portions 24, the medium material portions 23 are for example formed by a transparent polymer material, as long as the refractive indices thereof may meet above conditions. As an exemplary embodiment of the disclosure, the waveguide material portions 24 and the medium material portions 23 are for example formed by photopolymer; i.e., photopolymer is for example coated/applied so as to form an optical waveguide layer and then the photopolymer of the optical waveguide layer may be exposed by different exposures so as to form the waveguide material portions 24 and the medium material portions 23 respectively.

Figure 5:
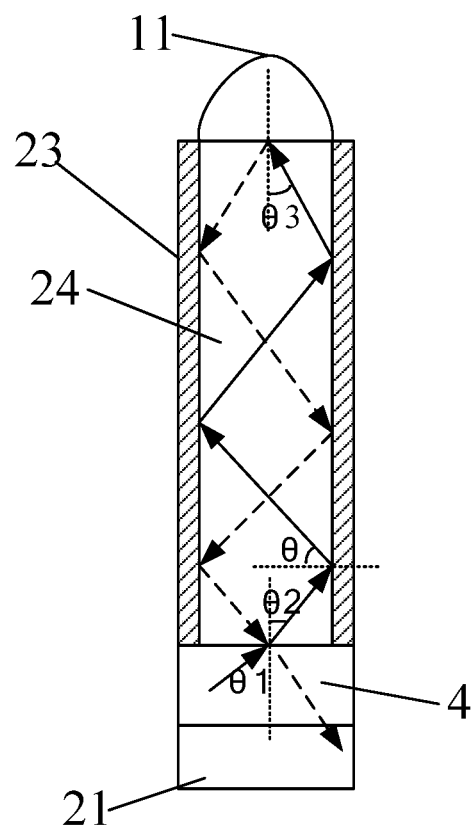
FIGS. 5-8 illustrate structural schematic views of a fingerprint identification device according to a second embodiment of the disclosure.

A method for controlling the fingerprint identification device as above is further provided in embodiments of the disclosure. As illustrated in FIG. 5, there is an angle θ1 between a direction of propagation of a light irradiating towards the first interface and a normal of the first interface, and there is also an angle θ2 between a direction of a light irradiating towards the second interface from the first interface and a normal of the first interface; and there is an angle θ3 between a direction of propagation of a light irradiating towards the fourth interface and a normal of the fourth interface; and there is an angle θ between a direction of propagation of a light irradiating towards the second interface and the normal of the second interface.

Depending on Law of Refraction, there is a formula of n1 sin θ1=n2 sin θ2. And since an incident light is reflected by total reflection inside the waveguide material portion 24, then, there is a similar formula of n2 sin θ=n3, wherein there is an relationship of θ2+θ=90°; in other words, the second formula is further converted to be: θ2=arc cos (n3/n2).

Therefore, in a condition that there meets a constraint condition of $$\theta1 \leq \arcsin\left[\frac{n2}{n1}\sin\left(\arccos\left(\frac{n3}{n2}\right)\right)\right],$$

then the light irradiating towards the first interface is reflected by total reflection at both the second interface and the third interface and then propagates to the fourth interface.

Figure 6:
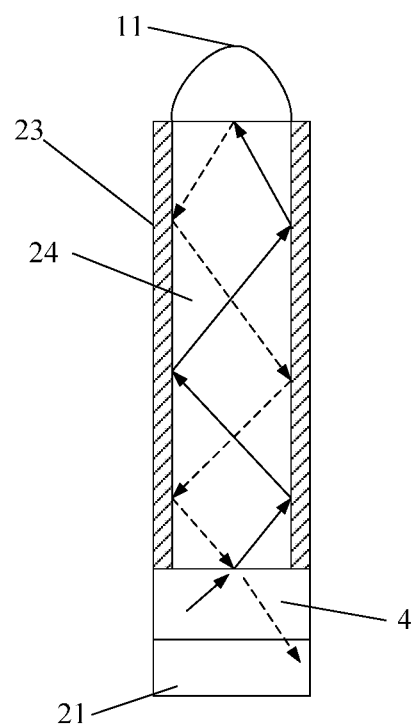

When the valley 11 of the fingerprint gets in touch with the fourth interface, due to the condition that the light is reflected by total reflection at the first interface and between the second interface and the third interface and due to geometrical relationship, it may be known that θ2=θ3; and the light is reflected by total reflection at the fourth interface due to the existence of the valley of the fingerprint at the fourth interface, since the fourth interface is essentially an interface between air and the waveguide material portion and air has a refractive index of substantially 1, then there is an relationship of n2 sin θ2=1. Therefore, if there is a relationship of $$\theta2 \geq \arcsin\frac{1}{n2},$$

then, as illustrated in FIG. 6, the photoelectric sensor 21 receives the light which returns by total reflection firstly at the fourth interface and then at the second interface and the third interface.

Figure 7:
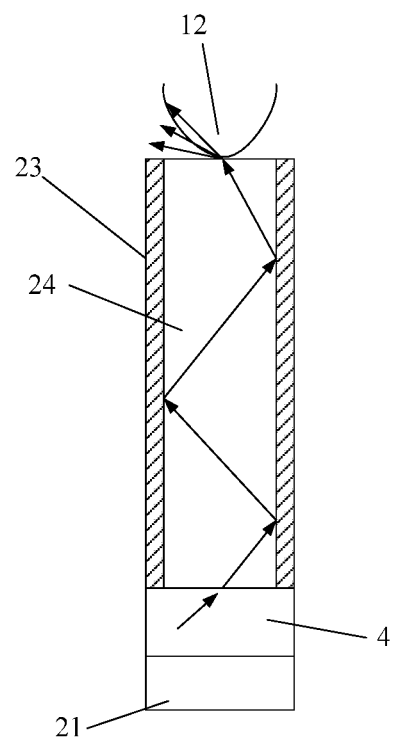

In comparison, once the ridge 12 of the fingerprint get in touch with the fourth interface, as illustrated in FIG. 7, since the ridge has a greater refractive index, the condition of total reflection between the waveguide material portion 24 and the air then may be destroyed due to the existence of the ridge, and the light propagating in the waveguide material portion may be reflected by diffuse reflection at the fourth interface and in turn exits there, such that the photoelectric sensor 21 fails to receive any light which would return by total reflection at the fourth interface above all and then at both the second interface and the third interface.

Figure 8:
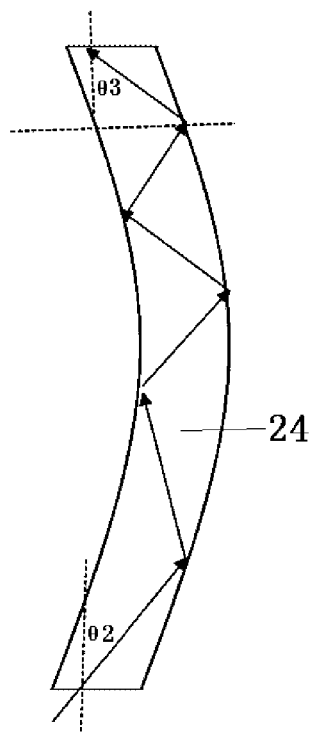

As another implementation of the embodiments of the disclosure, the waveguide material portion 24 and the medium material portions 23 of the optical waveguide 22 are for example illustrated in FIG. 8, both are provided to be structures in an arc-shaped form, i.e., cooperating with one another to form an optical waveguide 22 having a certain radian. Such an arc-shaped structure is provided such that an angle of total reflection at which the light travels inside the waveguide material portion 24 at interfaces between the waveguide material portion and the medium material portion may decrease continually; in other words, θ2 decreases and θ3 increases, so as to ensure that there occurs a total reflection at an external medium (i.e., air). The schematic view of FIG. 8 illustrates an exemplary embodiment in which both the second and the third interfaces protrude towards right hand side. It should be understood that, a condition in which both the second interface and the third interface protrude towards left hand side is also feasible, and a specific radian thereof may for example be adjusted depending on the refractive index of the waveguide material portions and the refractive index of the medium material portions.

In an exemplary embodiment of the disclosure, when conditions as below are met, i.e., $$\theta1 > \arcsin\left[\frac{n2}{n1}\sin\left(\arccos\left(\frac{n3}{n2}\right)\right)\right] \text{ and } \theta2 < \arcsin\frac{1}{n2},$$

then the light received by the photoelectric sensor is stray light.

And the method for controlling the fingerprint identification device further comprises a step of clearing the stray light before the implementation of the fingerprint identification.

In other words, in the embodiment, a light ray which meets constraint condition(s) may be utilized for fingerprint identification, since other light ray(s) failing to meet such condition(s) (also referred to as stray light) may not be restricted within the waveguide material portion 24, then such light ray(s) failing to meet such condition(s) may be refracted and reflected at various film layers and then may still possibly be received by the photoelectric sensor 21. However, since such a portion of the stray light exists intrinsically, then once the fingerprint identification device is formed, for example, the stray light should be processed by the step of clearing so as to eliminate interference. To be specific, by way of example, the stray light received by the photoelectric sensor 21 is recorded prior to the fingerprint identification, i.e., a calculation is implemented in consideration of the existence of an light intensity of the stray light so as to implement an identification for distinguishing between the valley and the ridge depending on the difference therebetween.

Figure 9:
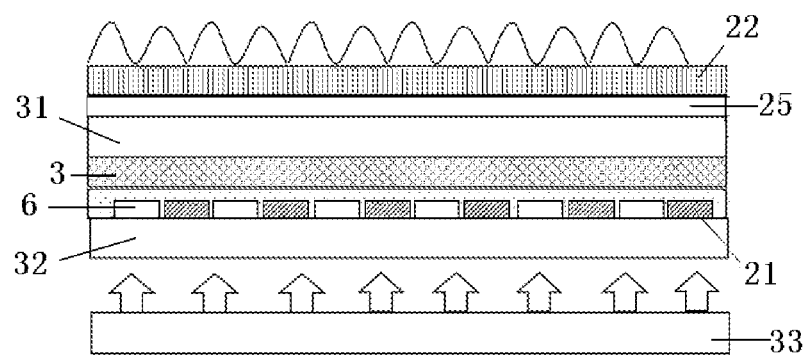
FIGS. 9-11 illustrate structural schematic views of a fingerprint identification device according to a third embodiment of the disclosure.

There is further provided a touch display panel. As illustrated in FIG. 9, the touch display panel comprises not only above fingerprint identification device but also a touch display substrate. The optical waveguide 22 is provided on a touch display surface of the touch display substrate, and the photoelectric sensor 21 is provided on a side of the touch display substrate facing away from the optical waveguide 22.

In other words, the touch substrate 4 in this embodiment may be a touch display substrate. As illustrated in FIG. 9, the liquid crystal display panel is taken for example for description, a liquid crystal layer 3 is disposed between a color filter substrate 31 and an array substrate 32. The optical waveguide 22 is provided on the color filter substrate 31, and the photoelectric sensor 21 is provided on a surface of the array substrate 32 at a side thereof close to the color filter substrate 31. Once the light originating from the backlight source 33 is incident onto a lower surface of the waveguide material portion 24 and irritates therein, the light is reflected sever times by total reflection at interfaces between the medium material portion 23 and the waveguide material portion 24 and then propagates to the surface of the waveguide material portion 24 facing away from the color filter substrate 31. As such, if the valley 11 of the fingerprint gets in touch with the surface of the waveguide material portion 24 facing away from the color filter substrate 31, then, due to the fact that the valley 11 is filled with air, the light is reflected by total reflection and returns to be identified by the photoelectric sensor 21. And if the ridge 12 of the fingerprint gets in touch with the surface of the waveguide material portion 24 facing away from the color filter substrate 31, then the light is reflected by diffuse reflection at the ridge 12 and in turn emits outwards therefrom so as not to be reflected back and thus not to be substantially identified by the photoelectric sensor 21. Here, the expression "not to be substantially identified" means that even if some portion of the light may be reflected back by diffuse reflection and received at the photoelectric sensor, the intensity of such portion of the light received at the photoelectric sensor may not be sufficient to complete the identification. As such, it increases the difference between the light which is reflected back at the ridge 12 and identified by the photoelectric sensor 21 and the light which is reflected back at the valley 11 and identified by the photoelectric sensor 21, so as to further enhance the accuracy in identification of valley(s) 11 and ridge(s) 12 by the photoelectric sensor 21.

Figure 10:
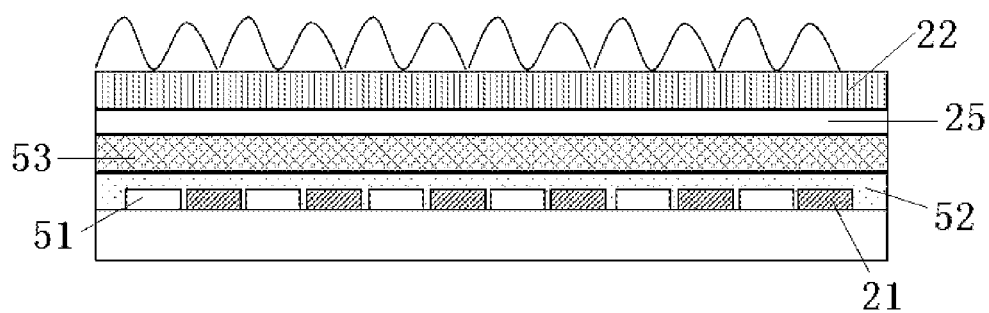

As a specific implementation of the embodiment of the disclosure, as illustrate in FIG. 10, the touch substrate 4 is of an OLED structure, the OLED structure comprising a light-emitting layer 51, an encapsulation layer 52 and a covering layer 53 arranged in sequence. And the fingerprint identification device further comprises a buffer layer 25 which is disposed between the optical waveguide 22 and the touch substrate 4, and is configured that a refractive index of a material forming the buffer layer 25 is the same as a refractive index of a material forming the encapsulation layer 52.

In other words, the buffer layer 25 is added to the optical waveguide 22 and functions for refractive index matching, That is to say, the refractive index of the buffer layer 25 is equal to the refractive index of the encapsulation layer 52, which fact may not change a direction in which the light ray propagates; in other words, the light is reflected downward at the finger and travels through the buffer layer 25, the covering layer 53 to the encapsulating layer 52, with its propagating direction remaining unchanged.

In an exemplary embodiment of the disclosure, as illustrated in FIG. 9, the touch display substrate comprises: pixel regions 6; and non-pixel regions on peripheries of the pixel regions 6, with the photoelectric sensor 21 being arranged in the non-pixel regions.

Specifically, for example, the non-pixel regions of the OLED function as a Pixel defining layer (PDL), the pixel regions are formed by the light-emitting layer 51, and the photoelectric sensor 21 is provided above the PDL; as such, an aperture ratio of the display device may not be influenced. If the light-emitting points of the light-emitting layer 51 are formed to be smaller, then, depending on results of simulation experiment, in a condition that an area of a light-emitting point is equal to that of a corresponding photoelectric sensor 21, the effect of the fingerprint identification is optimized.

Figure 11:
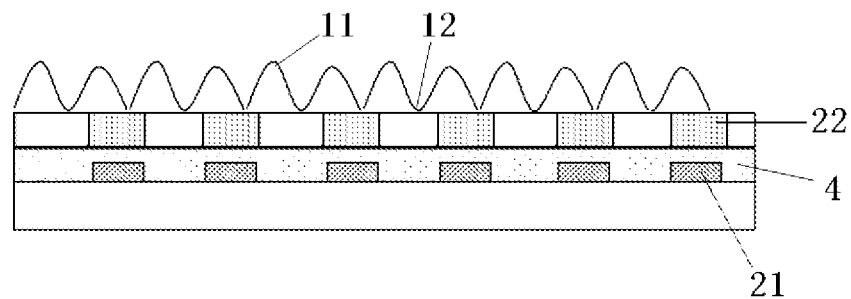

As illustrated in FIG. 11, in the exemplary embodiment of the disclosure, the optical waveguide comprises a plurality of optical sub-waveguides 22, and the photoelectric sensor comprises a plurality of photoelectric sub-sensors 21, the, the plurality of optical sub-waveguides 22 being in one-to-one correspondence with the plurality of photoelectric sub-sensors 21. Specifically, for example, the plurality of optical sub-waveguides 22 and the plurality of photoelectric sub-sensors 21 are arranged at a certain angle (e.g., at an identical angle) in relation to the plurality of photoelectric sub-sensors 21. Alternatively, the plurality of optical sub-waveguides 22 may for example be arranged to be in perfect alignment with the plurality of photoelectric sub-sensors 21 in the vertical direction.

In other words, the plurality of optical sub-waveguides 22 are formed as an integral layer, or for example are provided at positions corresponding to the plurality of photoelectric sub-sensors 21 as illustrated in FIG. 11.

It is apparent that the specific implementations of above embodiments of the disclosure may be subject to various changes, e.g., a specific material for the waveguide material portion(s) 24 and a specific material for the medium material portions 24 within the optical waveguide 22 may be chosen as per practical requirements of specific products.

There is further provided a touch display device, comprising above touch display panel. The touch display device may for example be: liquid crystal panel, electronic paper, OLED panel, mobilephone, tablet computer, televisions set, display, laptop computer, digital photo frame, navigator and any other product or component having display functionality.

The fingerprint identification device in the embodiment of the disclosure comprises the photoelectric sensor(s) and the optical waveguide(s), provided on the touch substrate. Once a light irradiates into a corresponding one of waveguide material portions, it is then reflected several times by total reflection at interfaces between the waveguide material portion and the medium material portion and then propagates to a surface of the waveguide material portion facing away from the touch substrate. If the valley of the fingerprint gets in touch with the upper end surface of the waveguide material portion facing away from the touch substrate, then, due to the fact that the valley is filled with air, the light is reflected by total reflection and returns to be identified by the photoelectric sensor. And if the ridge of the fingerprint gets in touch with the upper end surface of the waveguide material portion facing away from the touch substrate, then the light is reflected by diffuse reflection at the ridge so as not to be substantially identified by the photoelectric sensor.

Here, the expression "not to be substantially identified" means that even if some portion of the light may be reflected back by diffuse reflection and received at the photoelectric sensor, the intensity of such portion of the light received at the photoelectric sensor may not be sufficient to complete the identification. As such, it increases the difference between the light which is reflected back at the ridge and identified by the photoelectric sensor 21 and the light which is reflected back at the valley and identified by the photoelectric sensor 21, so as to further enhance the accuracy in identification of valley(s) and ridge(s) by the photoelectric sensor. The fingerprint identification device is adapted to various display devices.

It should be appreciated for those skilled in this art that the above embodiments are only exemplary embodiments intended to illustrate the operation principle of the disclosure, rather than being limited thereto. As to those skilled in the art, various variations and/or modifications may be made in these embodiments, without departing from the principles and spirit of the disclosure, and these variations and/or modifications still lie within the scope of present application.

What is claimed is:

1. A fingerprint identification device, comprising:
   a photoelectric sensor; and
   an optical waveguide, arranged on a touch substrate, and configured to be in touch with a fingerprint, and comprising waveguide material portions and medium material portions, each of the waveguide material portions and each of the medium material portions being spaced apart from each other,
   wherein surfaces of both the medium material portions and the waveguide material portions facing away from the touch substrate are configured to be in touch with the fingerprint, and the optical waveguide is configured to deliver a light irradiating into the waveguide material portions from the touch substrate, to the surfaces of the waveguide material portions facing away from the touch substrate by total reflections at interfaces between the medium material portions and the waveguide material portions;
   wherein a surface of each of the waveguide material portions interfacing with the touch substrate is defined as a first interface, two surfaces of each of the waveguide material portions interfacing with the two adjacent medium material portions respectively are defined as a second interface and a third interface, and a surface of each of the waveguide material portions facing away from the touch substrate is defined as a fourth interface;
   wherein in a condition that a portion of valleys of the fingerprint gets in touch with the optical waveguide, the light which irradiates into each of the waveguide material portions from the first interface thereof is reflected by total reflection at both the second interface and the third interface thereof, then transmitted to and reflected back by total reflection at the fourth interface thereof, and in turn reflected back by total reflection at both the second interface and third interface again to return to the photoelectric sensor for identification thereby;
   wherein in a condition that a portion of ridges of the fingerprint faces towards and gets in touch with the optical waveguide, the light which irradiates into each of the waveguide material portions from the first interface thereof is reflected by total reflection at both the second interface and third interface and propagates to the fourth interface thereof and exits from the fourth interface, so as not to be substantially identified by the photoelectric sensor; and
   wherein the second surface and the third surface are both arc-shaped surfaces protruding towards a side on which side one of the second interface and the third interface is located.

2. The fingerprint identification device according to claim 1, wherein
   the waveguide material portions have a refractive index of n2, and the medium material portions have a refractive index of n3, and a material of the touch substrate has a refractive index of n1, and
   wherein both n3 and n1 are less than n2.

3. A touch display panel, comprising:
   a touch display substrate; and
   a fingerprint identification device, comprising:
      a photoelectric sensor; and
      an optical waveguide, arranged on the touch display substrate, and configured to be in touch with a fingerprint, and comprising waveguide material portions and medium material portions, each of the waveguide material portions and each of the medium material portions being spaced apart from each other,
   wherein surfaces of both the medium material portions and the waveguide material portions facing away from the touch display substrate are configured to be in touch with the fingerprint, and the optical waveguide is configured to deliver a light irradiating into the waveguide material portions from the touch display substrate, to the surfaces of the waveguide material portions facing away from the touch display substrate by total reflections at interfaces between the medium material portions and the waveguide material portions,
   wherein the optical waveguide is provided on a touch display surface of the touch display substrate, and the photoelectric sensor is provided at a side of the touch display substrate facing away from the optical waveguide;
   wherein a surface of each of the waveguide material portions interfacing with the touch substrate is defined as a first interface, two surfaces of each of the waveguide material portions interfacing with the two adjacent medium material portions respectively are defined as a second interface and a third interface, and a surface of each of the waveguide material portions facing away from the touch substrate is defined as a fourth interface;
   wherein in a condition that a portion of valleys of the fingerprint gets in touch with the optical waveguide, the light which irradiates into each of the waveguide material portions from the first interface thereof is reflected by total reflection at both the second interface and the third interface thereof, then transmitted to and reflected back by total reflection at the fourth interface thereof, and in turn reflected back by total reflection at both the second interface and third interface again to return to the photoelectric sensor for identification thereby;
   wherein in a condition that a portion of ridges of the fingerprint faces towards and gets in touch with the optical waveguide, the light which irradiates into each of the waveguide material portions from the first interface thereof is reflected by total reflection at both the second interface and third interface and propagates to the fourth interface thereof and exits from the fourth interface, so as not to be substantially identified by the photoelectric sensor; and wherein the second surface and the third surface are both arc-shaped surfaces protruding towards a side on which side one of the second interface and the third interface is located.

4. The touch display panel according to claim 3, wherein the optical waveguide comprises a plurality of optical sub-waveguides, and the photoelectric sensor comprises a plurality of photoelectric sub-sensors, the plurality of optical sub-waveguides being in one-to-one correspondence with the plurality of photoelectric sub-sensors.

5. The touch display panel according to claim 3, wherein the touch display substrate comprises:
pixel regions; and
non-pixel regions on peripheries of the pixel regions, with the photoelectric sensor being in the non-pixel regions.

6. The touch display panel according to claim 3, wherein the touch display substrate is of an OLED structure comprising a light-emitting layer, an encapsulation layer and a covering layer arranged in sequence, and
wherein the fingerprint identification device further comprises a buffer layer between the optical waveguide and the touch display substrate and the buffer layer is configured such that a refractive index of a material forming the buffer layer is equal to a refractive index of a material forming the encapsulation layer.

7. The touch display panel according to claim 3, further comprising:
a color filter substrate; and
an array substrate opposite to a color filter substrate,
wherein the photoelectric sensor is on a side of the array substrate close to the color filter substrate.

8. A method for controlling a fingerprint identification device, wherein the fingerprint identification device comprises:
a photoelectric sensor; and
an optical waveguide, arranged on a touch substrate, and configured to be in touch with a fingerprint, and comprising waveguide material portions and medium material portions, each of the waveguide material portions and each of the medium material portions being spaced apart from each other,
wherein surfaces of both the medium material portions and the waveguide material portions facing away from the touch substrate are configured to be in touch with the fingerprint, and the optical waveguide is configured to deliver a light irradiating into the waveguide material portions from the touch substrate, to the surfaces of the waveguide material portions facing away from the touch substrate by total reflections at interfaces between the medium material portions and the waveguide material portions;
wherein a surface of each of the waveguide material portions interfacing with the touch substrate is defined as a first interface, two surfaces of each of the waveguide material portions interfacing with the two adjacent medium material portions respectively are defined as a second interface and a third interface, and a surface of each of the waveguide material portions facing away from the touch substrate is defined as a fourth interface;
wherein in a condition that a portion of valleys of the fingerprint gets in touch with the optical waveguide, the light which irradiates into each of the waveguide material portions from the first interface thereof is reflected by total reflection at both the second interface and the third interface thereof, then transmitted to and reflected back by total reflection at the fourth interface thereof, and in turn reflected back by total reflection at both the second interface and third interface again to return to the photoelectric sensor for identification thereby;

wherein in a condition that a portion of ridges of the fingerprint faces towards and gets in touch with the optical waveguide, the light which irradiates into each of the waveguide material portions from the first interface thereof is reflected by total reflection at both the second interface and third interface and propagates to the fourth interface thereof and exits from the fourth interface, so as not to be substantially identified by the photoelectric sensor; and wherein the second surface and the third surface are both arc-shaped surfaces protruding towards a side on which side one of the second interface and the third interface is located;

the method comprising:
implementing an identification of fingerprint by the photoelectric sensor depending on a signal of the light reflected at the fingerprint, which signal is received by the photoelectric sensor, in a condition that the fingerprint identification device is in touch with fingerprint.

9. The method according to claim 8, wherein there is an angle $\theta 1$ between a light irradiating towards the first interface and a normal of the first interface, by controlling according to a formula of:

$$\theta 1 \leq \arcsin\left[\frac{n2}{n1}\sin\left(\arccos\left(\frac{n3}{n2}\right)\right)\right]$$

such that the light irradiating towards the first interface is reflected by total reflection at both the second interface and the third interface and in turn propagates to the fourth interface, wherein a material of the touch substrate has a refractive index of n1, the waveguide material portion has a refractive index of n2 and the medium material portion has a refractive index of n3.

10. The method according to claim 9, wherein there is an angle $\theta 2$ between a direction of a light irradiating towards the second interface from the first interface and a normal of the second interface, by controlling according to a formula of:

$$\theta 2 \geq \arcsin\frac{1}{n2}$$

such that the light is reflected in its return by total reflection at the fourth interface and then at both the second interface and the third interface respectively and is in turn received by the photoelectric sensor.

11. The method according to claim 8, further comprising a step of recording a signal of stray lights received by the photoelectric sensor before implementing the identification of fingerprint, and wherein implementing the identification of fingerprint by the photoelectric sensor depending on a signal of the light reflected at the fingerprint which signal is received by the photoelectric sensor comprises subtracting the signal of stray lights from the signal of the light reflected at the fingerprint which signal is received by the photoelectric sensor, followed by implementing the identification of fingerprint.

* * * * *